(12) United States Patent
Maloney

(10) Patent No.: US 6,231,991 B1
(45) Date of Patent: May 15, 2001

(54) THERMAL BARRIER COATING SYSTEMS AND MATERIALS

(75) Inventor: Michael J. Maloney, Port St. Lucie, FL (US)

(73) Assignee: United Technologies Corporation, Hartford, CT (US)

( * ) Notice: Subject to any disclaimer, the term of this patent is extended or adjusted under 35 U.S.C. 154(b) by 0 days.

(21) Appl. No.: 09/436,212

(22) Filed: Nov. 8, 1999

Related U.S. Application Data

(62) Division of application No. 08/764,419, filed on Dec. 12, 1996, now Pat. No. 6,117,560.

(51) Int. Cl.⁷ ..................................................... B32B 9/00
(52) U.S. Cl. ...................... 428/469; 428/472; 428/472.2; 416/241 B
(58) Field of Search ................................. 428/469, 472, 428/472.2; 416/241 B

(56) References Cited

U.S. PATENT DOCUMENTS

| | | | |
|---|---|---|---|
| 3,718,499 | 2/1973 | Kanter | 117/127 |
| 3,954,512 | 5/1976 | Kanter | 148/6.35 |
| 4,247,249 | 1/1981 | Siemers | 415/174 |
| 4,321,310 | 3/1982 | Ulion et al. | 428/612 |
| 4,321,311 | 3/1982 | Strangman | 428/623 |
| 4,639,399 | 1/1987 | Aprigliano | 428/623 |
| 4,753,902 | 6/1988 | Ketcham | 501/87 |
| 4,849,142 | 7/1989 | Panda et al. | 264/40.6 |
| 4,891,343 | 1/1990 | Quadair | 501/103 |
| 4,996,117 | 2/1991 | Chu et al. | 428/633 |
| 5,017,532 | 5/1991 | Sonnenberg et al. | 501/103 |
| 5,495,979 | 3/1996 | Sastri et al. | 228/124.1 |
| 5,512,382 | 4/1996 | Strangman | 428/632 |
| 5,562,998 | 10/1996 | Strangman | 428/612 |

(List continued on next page.)

FOREIGN PATENT DOCUMENTS 0 825 271 A1    2/1998 (EP) .............................. C23C/28/00

OTHER PUBLICATIONS

M.A. Subramanian, G. Aravamudan and G.V. Subba Rao, "Oxide Pyrochlores—A Review".

Harry L. Tuller and Peter K. Moon, "Fast Ion Conductors: Future Trends".

M. J. Maloney, "High Efficiency Thermal Barrier Coatings for Advanced Alloy Airfoils", Mar. 15, 1996.

Robert S. Roth, "Pyrochlore–Type Compounds Containing Double Oxides of Trivalent and Tetravalent Ions", vol. 56, No., 1, Jan. 1956, Journal of Research of the National Bureau of Standards, pp. 17–25.

M. Kakihana, M.M. Milanova, M. Arima, T. Okubo, M. Yashima and M. Yoshimura, "Polymerized Complex Route to Synthesis of Pure $Y_2Ti_2O_7$ at 750°C Using Yttrium–Titanium Mixed–Metal Citric Acid Complex", pp. 1673–1676.

Periodic Table of The Elements.

(List continued on next page.)

*Primary Examiner*—Deborah Jones
*Assistant Examiner*—Bryant Young
(74) *Attorney, Agent, or Firm*—F. Tyler Morrison

(57) ABSTRACT

A new family of ceramic materials is identified having particular utility as thermal insulating or thermal barrier coatings on metallic substrates. The ceramic materials have a pyrochlore structure and are typified by the composition $A_2B_2O_7$ where A and B are various ions and 0 is oxygen. A may have a positive charge of $3^+$ or $2^+$ and B may have a positive charge of $4^+$ or $5^+$. These materials are characterized by having chemical stability, thermal stability and thermal insulating properties superior to those of currently used thermal barrier ceramics. An example pyrochlore material is lanthanum zirconate.

14 Claims, 7 Drawing Sheets

U.S. PATENT DOCUMENTS

| | | | |
|---|---|---|---|
| 5,652,044 | 7/1997 | Rickerby | 428/216 |
| 5,658,837 | 8/1997 | Quadir | 501/103 |
| 5,716,720 | 2/1998 | Murphy | 428/623 |
| 5,722,379 | 3/1998 | Binder et al. | 123/668 |
| 5,743,188 | 4/1998 | Ghosh et al. | 101/467 |
| 5,763,107 | 6/1998 | Rickerby et al. | 428/623 |
| 5,780,178 | 7/1998 | Jones | 428/697 |
| 5,814,262 | 9/1998 | Ketcham et al. | 264/316 |

OTHER PUBLICATIONS

Patent Disclosure by M.J. Maloney, "Rare Earth Pyrochlore Zirconate Base Thermal Barrier Coatings".

Fig. 5232.

Two Oxides, Figs. 2373–2376 p. 103.

P. 341 Fd3mO7h.

Two Oxides, Figs. 6469–6470 p. 165.

Ronald A. McCauley, "Structural Characteristics of Pyrochlore Formation", pp. 290–294.

Two Oxides, Figs. 4376–4379 pp. 135–136.

Ernest M. Levin and Howard F. McMurdie, "Phase Diagrams for Ceramists 1975 Supplement", 3 pgs.

Lide, David R., *CRC Handbook of Chemistry and Physics*, (Baca Raton: CRC Press) pp: 4–15,4–24,4–25,4–64,4–91, 4–35.

Uhlig, Herbert H., editor, *The Corrosion Handbook*, (New York: John Wiley & Sons, Inc., 1948) 5 pages.

- Zr
- La
- O

- Zr
- O

FIG.3A
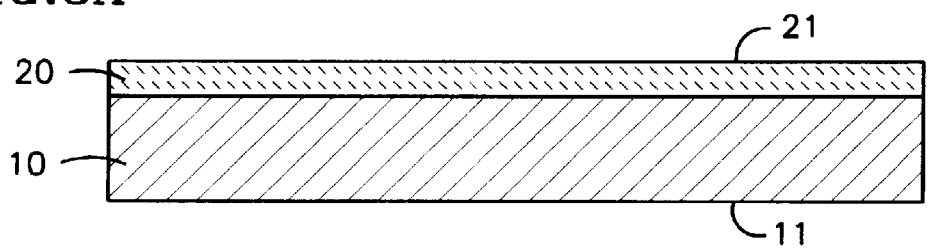
FIG.3B
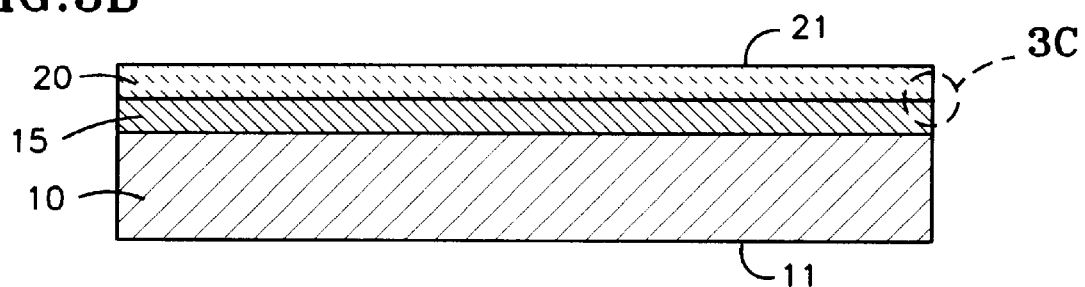
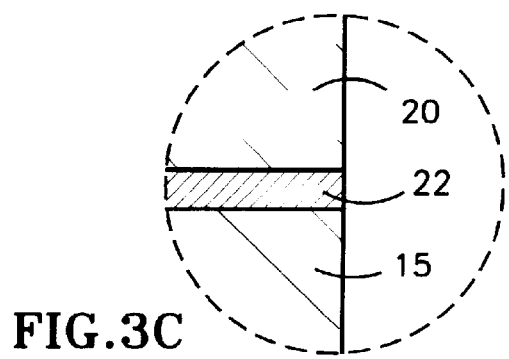
FIG.3C

$La_2O_3$-$ZrO_2$

THERMAL BARRIER COATING SYSTEMS AND MATERIALS

This is a divisional of prior co-pending application Ser. No. 08/764,419, filed on May 22, 1998, a continuing prosecution application of Ser. No. 08/764,419 filed on Dec. 12, 1996 U.S. Pat. No. 6,117,560.

FIELD OF THE INVENTION

This invention relates to a class of ceramic materials for thermal barrier coatings, to thermal barrier coatings made of such materials, and to metallic parts having such thermal barrier coatings. The thermal barrier coatings have particular utility in gas turbine engines. The ceramic materials are a family of ceramics having a pyrochlore structure.

BACKGROUND OF THE INVENTION

Gas turbine engines are well developed mechanisms for converting chemical potential energy, in the form of fuel, to thermal energy and then to mechanical energy for use in propelling aircraft, generating electric power, pumping fluids etc. At this time the major available avenue for improved efficiency of gas turbine engines appears to be the use of higher operating temperatures. However the metallic materials used in gas turbine engines are currently very near their upper limits of thermal stability. In the hottest portion of modern gas turbine engines, metallic materials are used at gas temperatures above their melting points. They survive because they are air cooled. But excessive air cooling reduces engine efficiency.

Accordingly, there has been extensive development of thermal barrier coatings for use with cooled gas turbine aircraft hardware. By using a thermal barrier coating, the amount of cooling air required can be substantially reduced.

Such coatings are invariably based on ceramics; mullite, alumina, etc. have been proposed but zirconia is the current material of choice. Zirconia must be modified with a stabilizer to preserve its cubic crystal structure at elevated temperatures, typical stabilizers include yttria, calcia, ceria and magnesia.

Generally speaking, metallic materials have coefficients of thermal expansion which exceed those of ceramic materials, consequently one of the problems that must be addressed in the development of successful thermal barrier coatings is to match the coefficient of thermal expansion of the ceramic material to the metallic substrate so that upon heating, when the substrate expands, the ceramic coating material does not crack. Zirconia has a high coefficient of thermal expansion and this is a primary reason for the success of zirconia as a thermal barrier material on metallic substrates.

Thermal barrier coatings have been deposited by several techniques including thermal spraying (plasma, flame and HVOF), sputtering and electron beam physical vapor deposition (EBPVD). Of these techniques, electron beam physical vapor deposition is currently a preferred technique for demanding applications because it produces a unique coating structure. Electron beam physical vapor deposited ceramic materials, when applied according to certain parameters, have a columnar grain microstructure consisting of small columns separated by gaps which extend into the coating. These gaps allow substantial substrate expansion without coating cracking and/or spalling see U.S. Pat. No. 4,321,311. According to U.S. Pat. No. 5,073,433 a similar structure (comprising segmentation cracks), although on a larger scale, can be obtained by plasma spray techniques.

Despite the success with the current use of electron beam physical vapor deposited zirconia base coatings there is a continuing desire for improved coatings which exhibit superior thermal insulation capabilities, especially improved in insulation capabilities when normalized for coating density. Weight is always a critical factor when designing gas turbine engines, particularly in rotating parts. Ceramics thermal barrier coatings are not load supporting materials, consequently they add weight without increasing strength. There is a strong desire for a ceramic thermal barrier material which adds the minimum weight while providing the maximum thermal insulation capability. In addition there are obviously the normal desires for long life, stability, economy etc.

Although this coating was developed for application in gas turbine engines, the invention clearly has utility in other applications where high temperatures are encountered such as furnaces.

DESCRIPTION OF THE DRAWINGS

FIG. 3a depicts a ceramic coating directly on a metallic substrate.

FIG. 3b depicts a ceramic coating on a metallic substrate with an intermediate bond coat.

FIG. 3c depicts an expanded view of the interface between the bond coat and the ceramic layer in FIG. 3b.

SUMMARY OF THE INVENTION

Figure 1A:
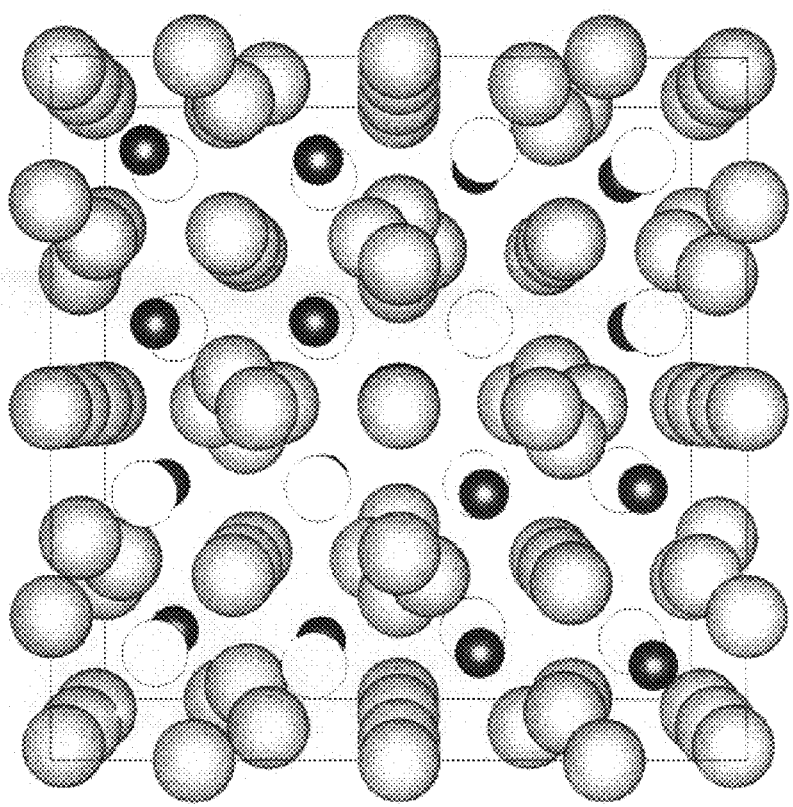
FIG. 1a depicts the crystal structure of lanthanum zirconate, a pyrochlore.

The essence of the present invention arises from the discovery that a class of ceramic materials has great utility as thermal barrier coatings on metallic substrates. These materials have a pyrochlore crystal structure.

The term pyrochlore is used to identify an ore of tantalum found in Canada. The term more generally describes a ceramic structure of the composition $A_2B_2O_7$ where A can have valance of $3^+$ or $2^+$ and B can have a valance of $4^+$ or $5^+$ and wherein the sum of the A and B valences is 7. The oxygen can be replaced by in part by sulfur or fluorine. Typical pyrochlores which we believe to have potential as thermal barrier coatings are those in which A is selected from the group consisting of lanthanum, gadolinium and yttrium and mixtures thereof and B is selected from the group consisting of zirconium, hafnium and titanium and mixtures thereof. Many other pyrochlores exist which also have potential as thermal barrier materials. See "Oxide Pyrochlores—A Review" by M. A. Subramanian et al, *Progress in Solid State Chemistry*, vol 15, pp 55–143, 1983 (incorporated herein by reference) for a full description of pyrochlores.

We have found that on a density adjusted basis pyrochlores which we have investigated have thermal insulating properties which exceed those of the more commonly used zirconia based thermal barrier materials. Additionally many of the pyrochlore materials have a phase relationship in which the pyrochlore structure is phase stable up to the melting point. Consequently stabilizing additions are not required. Most of the pyrochlores which we have investigated have melting points of more than 3000° F. (1650° C.) and generally more than 4000° F. (2200° C.). Additionally these materials adhere to alumina. These are all properties which are useful in thermal barrier coatings.

The invention coating materials and coatings will usually be used to protect a superalloy substrate from excess temperatures. Superalloys are metals, usually based on iron, nickel or cobalt and containing chromium and aluminum and usually titanium and refractory metals, and having useful properties above 1200° F. (650° C.). Other substrates, including steels, copper alloys and titanium alloys may be protected. Table I describes exemplary substrate materials.

TABLE I (wt % Exemplary Superalloy Compositions)

| | Cr | Co | W | Cb | Ti | Al | B | Hf | C | Ni | Ta | Mo | Zr | Re |
|---|---|---|---|---|---|---|---|---|---|---|---|---|---|---|
| PWA1422 | 9 | 10 | 12 | 1 | 2 | 5 | .015 | 1.6 | .14 | Bal | — | — | — | — |
| PWA1426 | 6.4 | 12.6 | 6.4 | — | — | 5.9 | 0.012 | 1.5 | — | Bal | 3.0 | 1.7 | .08 | .3 |
| PWA1480 | 10 | 5 | 4 | — | 1.5 | 5 | — | — | — | Bal | 12 | — | — | — |
| IN 792 | 12 | 9 | 3.8 | — | 4.1 | 3.5 | .015 | 0.5 | .12 | Bal | 3.9 | 1.9 | .12 | — |

As in other ceramic thermal barrier coatings, adherence of the pyrochlore ceramic to the alloy substrate is critical.

It is known from prior zirconia thermal barrier coatings that a metallic bond coat (sometimes described as an overlay coating) such as a MCrAlY is a superior bond coat for oxide ceramic coatings. It is also known that aluminide coatings are useful bond coats through generally not as durable as MCrAlY bond coats. The common feature of overlay coatings and aluminide coatings is that they both form adherent alumina surface films or scales.

A broad composition range for MCrAlY materials is 10–25% Cr, 5–15 Al, 0.1–1.0 Y balance selected from Fe, Ni, and Co and mixtures of Ni and Co. Additions of up to 5% each of Hf, Ta or Re, up to 1% of Si and up to 3% each of Os, Pt, Pd, or Rh may also be made. Table II describes exemplary MCrAlYs that can be applied by thermal spray processes, by EBPVD processes, and by electroplating.

TABLE II (wt % Exemplary MCrAlY Compositions)

| | Ni | Co | Cr | Al | Y | Hf | Si |
|---|---|---|---|---|---|---|---|
| NiCrAlY | Bal | — | 19.5 | 12.5 | .45 | — | — |
| CoCrAly | — | Bal | 18 | 11 | .45 | — | — |
| NiCoCrAlY | Bal | 23 | 18 | 12.5 | — | — | — |
| NiCoCrAlY | Bal | 22 | 17 | 12.5 | .6 | .25 | .4 |

An alternate bond coat is a diffusion aluminide formed by diffusing aluminum into the substrate surface. Diffusion aluminides are well known and may be applied using a mixture (termed a pack) containing an aluminum source, such as an aluminum alloy or compound, an activator (usually a halide compound such as NaF) and an inert material such as alumina. The part to be coated is buried in the pack and heated to 1500–2000° F. while a carrier gas, such as hydrogen, is flowed through the pack out of pack processes wherein the part is not buried in the pack are also known. The incorporation of precious metals such as Pt, Rh, Pd and Os into aluminide coatings is known. See U.S. Pat. No. 5,514,482 for a description of aluminide coating processes.

Combinations of overlay and aluminide coatings are also possible. See U.S. Pat. No. 4,897,315 for a description of a system having an inner MCrAlY overlay coating and an outer aluminide coating. See U.S. Pat. No. 4,005,989 for a description of the reverse combination, an inner aluminide coating and an outer overlay coating.

The common feature of these bond coats and bond coat combinations is that they form an adherent layer of alumina on their outer surface. The invention thermal barrier coating has limited solubility in alumina but bonds firmly to the alumina.

In certain cases, superalloys may form sufficiently perfect and adherent alumina layers that ceramics may adhere without a separate bond coat. See U.S. Pat. Nos. 5,262,245, 4,895,201, 5,034,284, 5,346,563, and 5,538,796.

To date all successful applications of ceramic coatings to superalloy has included oxide layer (usually alumina, rarely silica) between the bond coat (or substrate) and the ceramic coating.

DESCRIPTION OF THE PREFERRED EMBODIMENTS

The pyrochlore structure is a complex structure which can be described in a variety of ways, as a fluorite structure derivative, or as a network of octahedral linked corner to corner with cations filling the interstices.

Figure 1B:
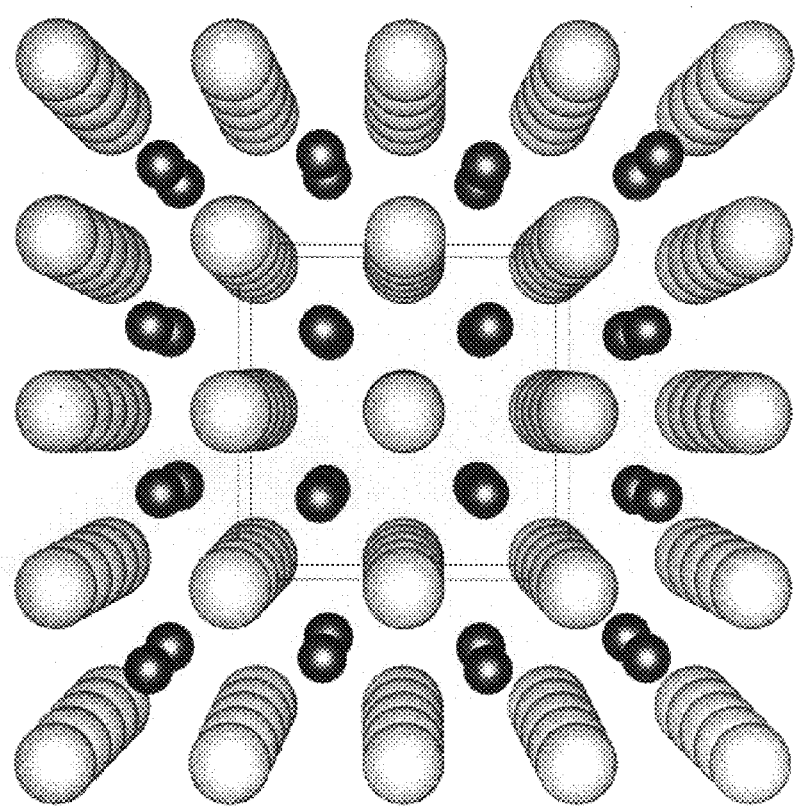
FIG. 1b depicts the crystal structure of zirconia, a fluorite structure.

FIG. 1a is a depiction of a cubic pyrochlore crystal structure. Regardless of structure description the pyrochlore structure has a chemical composition of $A_2B_2O_7$ or occasionally $A_2B_2O_6$ or $AB_2O_6$ with the latter two being referred to as defect pyrochlores. FIG. 1a illustrates lanthanum zirconate having an $A_2B_2O_7$ chemistry. FIG. 1b shows a cubic fluorite structure, the structure of stabilized zirconia. A comparison of FIGS. 1a and 1b shows both similarities and differences between the two structures. Both FIGS. 1a and 1b are views down the <100> crystal axis. Visually the pyrochlore structure appears to be less regular than the fluorite structure.

The A and B ions can have different valances as long as the sum of the A and B valences adds up to 7, in the case of the $A_2$, $B_2$ $O_7$ or 6 in the case of $A_2B_2O_6$ structures.

Figure 2:
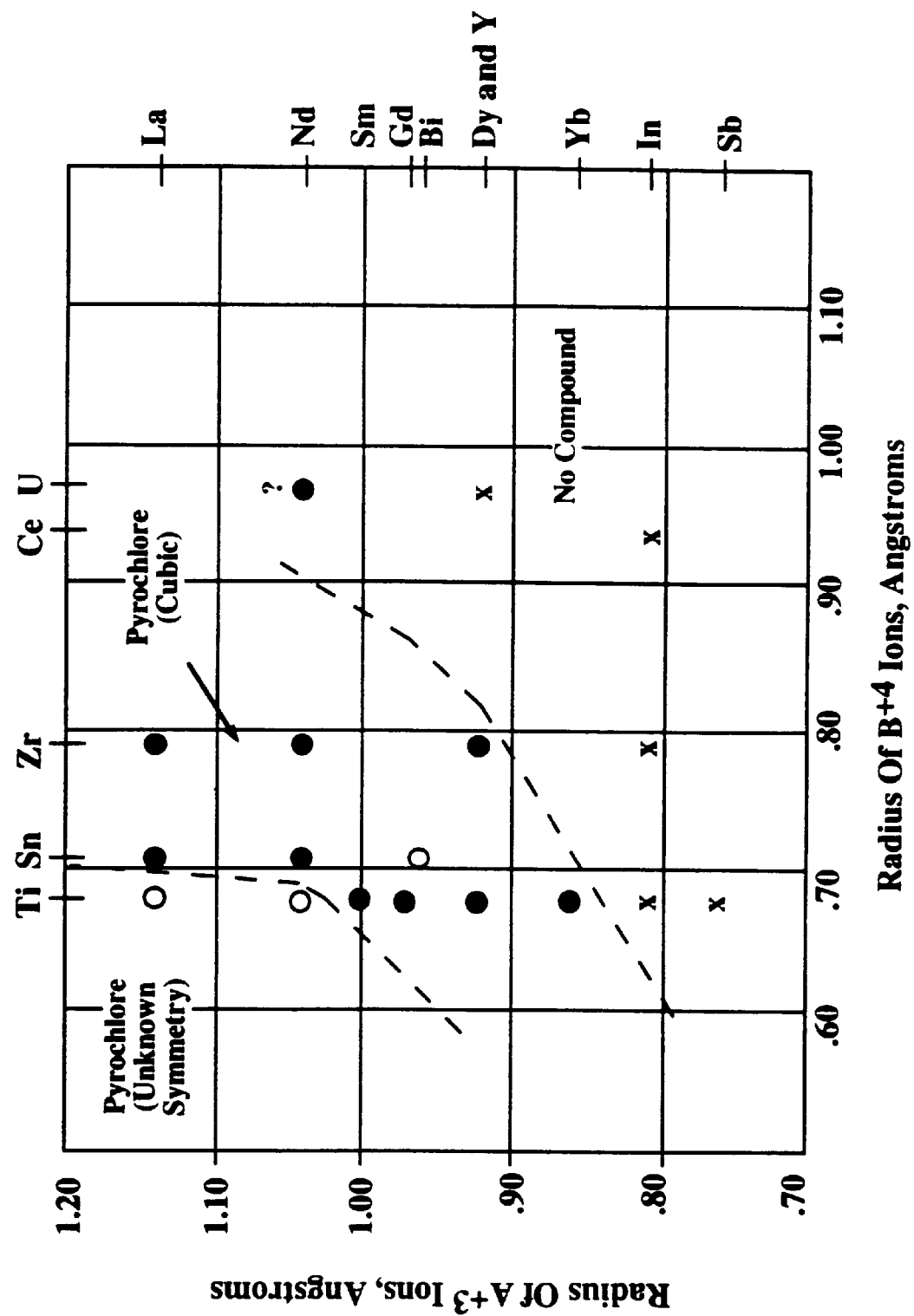
FIG. 2 shows the relationship between the A and B constituent ionic sizes necessary to produce a pyrochlore structure.

The pyrochlore structure forms only for certain relationships of A and B ionic radii. FIG. 2 illustrates this relationship indicating the general combination of A and B ionic radii which produce cubic pyroclilores. We have found that the boundaries of this diagram are somewhat uncertain and we believe, based on our investigations, that lanthanum titanate [$La_2Ti_2O_7$] has a stable cubic pyrochlore structure.

Noncubic pyrochlores are known but for the purpose of this invention we prefer to use ceramics which have a cubic pyrochlore structure.

As shown in FIG. 2, the formation of the desired cubic pyrochlore crystal structure is controlled by the relative ionic radii of the A and B constituents. It is possible to use a mixture of elements for the A and/or B constituents to provide an average ionic radius which will cause formation of a cubic pyrochlore structure. By way of example, from FIG. 2 it can be seen that both $Gd_2Ti_2O_7$ and $Y_2Zr_2O_7$ will have cubic pyrochlore structures. As a general rule, compounds of the formula $(Gd_xY_y)(Ti_aZr_b)$ $O_7$, where x+y=2 and a+b=2, will also have a cubic pyrochlore structure.

Further, a compound such as $1n_2Zr_2O_7$ which is not cubic could likely be rendered cubic through partial substitution of (for example) Nd for 1n and/or Ti for Zr, to bring the average A and B ionic radii into the cubic pyrochlore region shown in FIG. 2.

We have worked with the type of pyrochlores denoted by the $A_2B_2O_7$ formula and of these we prefer to use gadolinium, lanthanum or yttrium for the A ionic species and hafnium, titanium or zirconium for the B ionic species. Lanthanum zirconate seems particularly useful because lanthanum and zirconium have similar vapor pressures, making vapor deposition more readily possible. We have used only the materials of the $A_2B_2O_7$ structure and have not attempted the use of the known pyrochlores which have either fluorine or sulfur to substitute a portion of the oxygen but we do not believe that there is any reason to exclude the sulfur and fluorine substituted compositions from the present invention. We have also not experimentally evaluated the $A_2B_2O_6$ and $AB_2O_6$ structures but believe that they also may have utility in thermal barrier coatings.

Ti, Zr and Hf all display complete solid solubility in each other and we believe that any combination of Ti+Zr+Hf can be used as the B ionic species. Similarly, Gd, La and Y have substantial solid solubilities (Gd–La has complete solubility). Any combination of Gd+La+Y which does not form a second phase can be used as the A ionic species. These alloys of the A and B species must satisfy the criteria of FIG. 2 and possess a pyrochlore structure.

The low thermal conductivity of oxide pyrochlore compounds can be rationalized by consideration of crystallographic and chemical effects on thermal conductivity. The thermal conductivity of dielectric solids at elevated temperature is determined by phonon scattering by crystal imperfections and other phonons. Oxide pyroclilore compounds exhibit many of the features associated with low thermal conductivity materials. The pyrochlore crystal structure has a high intrinsic defect concentration. It has been experimentally established that as the difference in atomic mass between constituents in a compound increases, the thermal conductivity of that compound tends to decrease. Although the pyrochlore and fluorite structure are closely related, substitution of a high concentration of high atomic mass atoms (lanthanum, gadolinium and yttrium) into the fluorite structure provides a means to lower thermal conductivity that does not readily exist with stabilized zirconia compounds. It should be noted that, for thermal barrier applications, the benefits obtained from the reduction in thermal conductivity resulting from the use of high atomic mass elements must out weigh the debit incurred from higher density.

Reduction in thermal conductivity has also been associated with increasing complexity of crystallographic structure. As shown in FIG. 1a, the pyrochlore structure exhibits a greater degree of complexity than the fluorite structure shown in FIG. 1b. The cubic pyrochlore structure is similar to the cubic fluorite structure but with a large number of the oxygen atoms displaced (and one in eight missing).

Thermal barrier coatings are typically applied by thermal spray processes, such as plasma spray, in air (APS) or in low pressure (LPPS) by high velocity oxygen fuel processes (HVOF) or by detonation guns (D Gun). Electron beam physical vapor deposition (EBPVD) and sputtering are other techniques. Electron beam physical vapor deposition is a favored process. Depending upon the application and circumstances, each process has particular advantages. All of these processes can be readily used to apply oxide pyrochlore thermal barrier coatings. As previously discussed, the EBPVD process offers advantages since it develops a structure suited for extreme temperature applications and is therefore be most suitable for coating hot section turbine components. Thermal spray processing offers advantages in coating large components of complex shape and would be most suitable in coating components such as combustors.

FIGS. 3a, b and c illustrates variants of the thermal barrier coatings of the present invention. FIG. 3a depicts a coated article which comprises a superalloy substrate 10 having a pyrochlore top coat 20 on its outer surface 21. In gas turbine applications the backside 11 of the superalloy substrate 10 will be cooled by cooling air (not shown) and the outside front surface 21 of the pyrochlore will be exposed to elevated temperatures. There may also be holes between the outer surface and the backside permitting cooling air to flow from the backside to the outer surface. Angled and shaped cooling holes in combination with flowing hot gases on the outer surface can produce film cooling in which a layer of cool air separates the outside surface from the hot gases to further reduce heat flow. Heat will flow from the front surface 21 to the cooled surface 11 and the quantity of the heat flow will be substantially reduced by the pyrochlore layer. As previously mentioned the pyrochlore may be applied by various methods and the macrostructure of the pyroclilore layer will be largely a function of the deposition process. The most basic invention embodiment is a pyrochlore layer adhered to a substrate which reduces heat flow in the presence of a thermal gradient.

FIG. 3b illustrates a preferred construction which employs a bond coat 15 between the substrate 10 and the pyrochlore 20. The bond coat 15 improves adherence and provides oxidation protection for the substrate. FIG. 3c is an expanded view of the interlayer 16 between the bond coat 15 and the pyrochlore layer 20. An oxide layer 22, principally of alumina, exists at this interlayer and is believed to be principally responsible for the adherence of the pyrochlore.

It is known to augment the naturally occurring alumina layer on the bond coat by sputtering alumina onto the bond coat, in the case of zirconia thermal barrier coatings, and the use of a separately applied alumina layer (rather than a thermally grown oxide layer) is also an embodiment of this invention.

In a further embodiment another ceramic layer may be applied to the free surface of the pyrochlore. This added layer can be selected to reduce oxygen diffusion, to provide erosion and abrasion resistance, or to provide a desired thermal emissivity characteristic, or some combination of these characteristics.

EXAMPLE I

Figure 4:
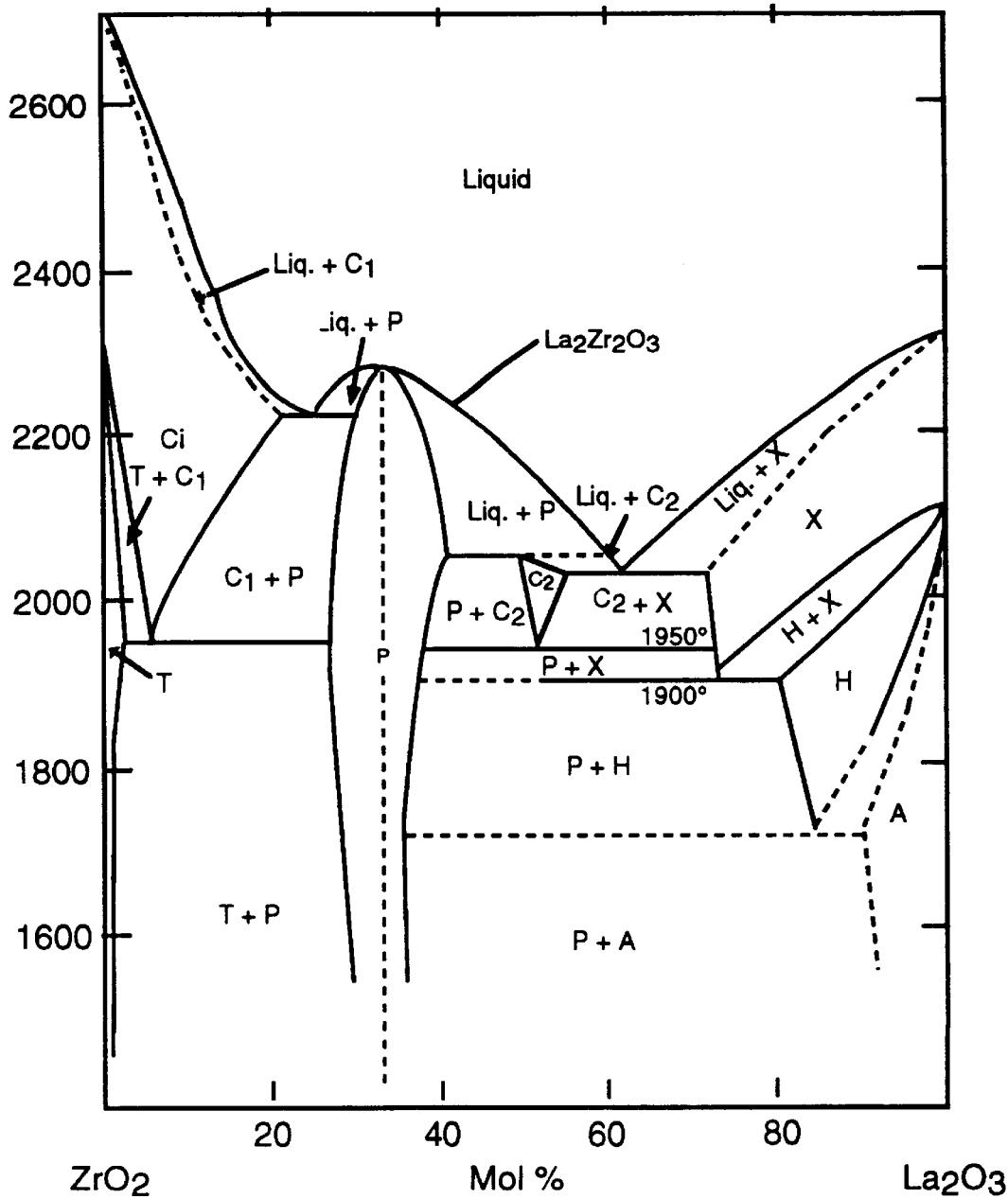
FIG. 4 shows the $ZrO_2$—$La_2O_3$ phase diagram.

The use of the $La_2Zr_2O_7$ (lanthanum zirconate) pyrochlore oxide compound as a EBPVD applied thermal barrier coating will be illustrated. The advantageous properties of the $La_2Zr_2O_7$ pyrochlore oxide relative to stabilized zirconia for thermal barrier coating include thermal conductivity, thermal expansion, density, and phase stability. FIG. 4 shows the $La_2O_3$—$ZrO_2$ phase diagram with the pyrochlore phase field labeled P. It can be seen that the pyrochlore structure (at about 35 mol % $La_2O_3$) is stable up to the melting point at about 2300° C. (4172° F.).

Figure 5:
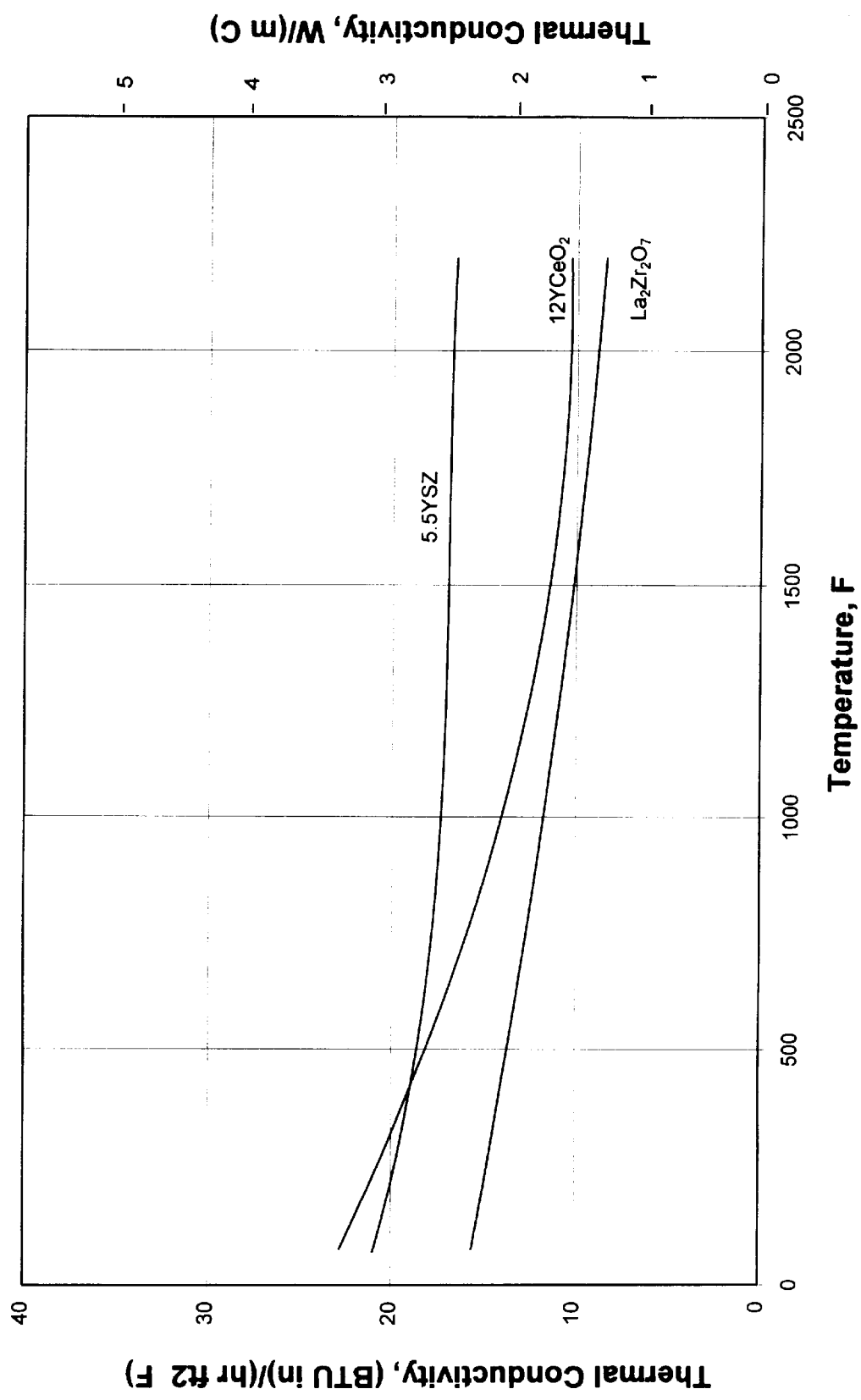
FIG. 5 shows the thermal conductivity of several ceramic materials.

FIG. 5 shows thermal conductivity of $La_2Zr_2O_7$ compared to the thermal conductivity of cubic zirconia as a function of temperature. At typical thermal barrier coating use temperatures, the pyrochlore compound exhibits a thermal conductivity which is about 50% that of stabilized zirconia. The density of the $La_2Zr_2O_7$ pyrochlore compound is approximately the same as stabilized zirconia (approximately 6 gr/cm$^3$) so on a weight corrected basis, the thermal conductivity benefit is also about 50%.

To illustrate the benefit, the 50 percent reduction thermal conductivity allows the coating thickness to be reduced by 50 percent for the same degree of thermal protection. Decreasing the coating mass by 50 percent on a typical turbine blade will lower the blade pull at the blade root by approximately 1,500 pounds (680 Kg), at typical operating conditions, which results in a significant increase in blade life and permits a reduction in mass of the disk to which the blades are attached. If the thermal barrier coating were held at the same thickness, and the cooling air flow held constant, the substrate temperature would be reduced by about 100° F. (55° C.), giving increased substrate creep life. Keeping the coating thickness constant and reducing the airflow would increase engine efficiency.

Figure 6:
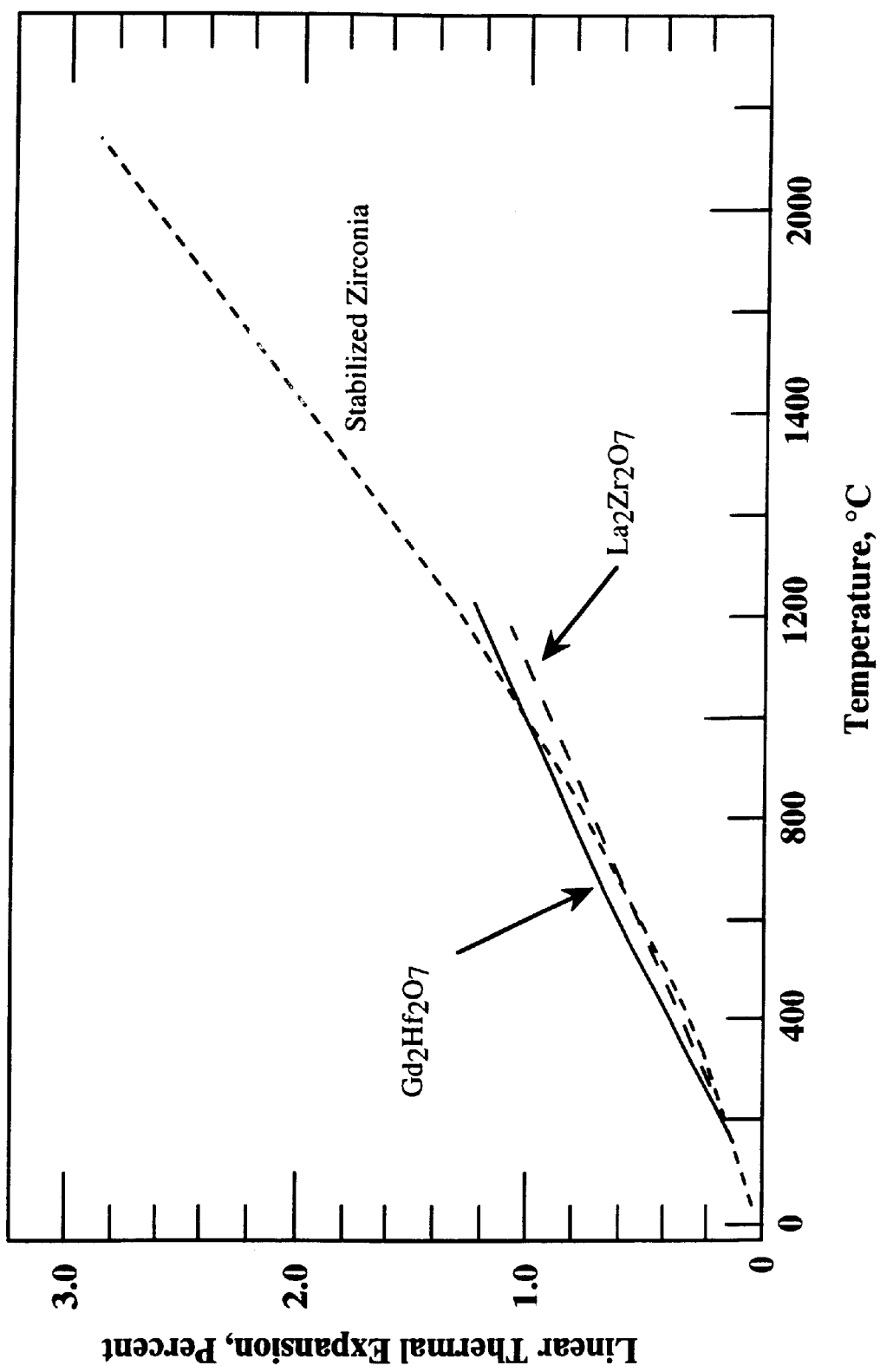
FIG. 6 shows the coefficient of thermal expansion for several ceramic materials.

FIG. 6 shows the mean coefficient of thermal expansion of $La_2Zr_2O_7$ compared to that of cubic stabilized zirconia as a function of temperature. The thermal expansion of $La_2Zr_2O_7$ thermal barrier coating can be seen to be similar to that of the cubic zirconia thermal barrier coating. This means that $La_2Zr_2O_7$ will behave similarly to zirconia during thermal cycling.

EXAMPLE II

Lanthanum zirconate was applied to a substrate by electron beam vapor deposition (EBPVD), in a controlled atmosphere chamber. The coating was applied to a single crystal substrate (of the nominal composition of PWA 1480 (see Table II)). The coating process was carried out in a vacuum of $3.2 \times 10^{-4}$ Torr with an oxygen flow rate of 50 sccm. Oxygen was added to ensure pyrochlore oxygen stoichiometry, see U.S. Pat. No. 5,087,477. The substrate temperature was 1840F during deposition with a substrate to source distance of 5.25 inches. The source pyrochlore ceramic was evaporated with an electron beam run at 0.8 A and 10,000 V. The source oxide was $La_2Zr_2O_7$ powder. The coating exhibited the favorable columnar grain structure typical of electron beam physical vapor deposited cubic zirconia thermal barrier coatings that provides strain relief and improved durability over plasma sprayed coatings.

Figure 7:
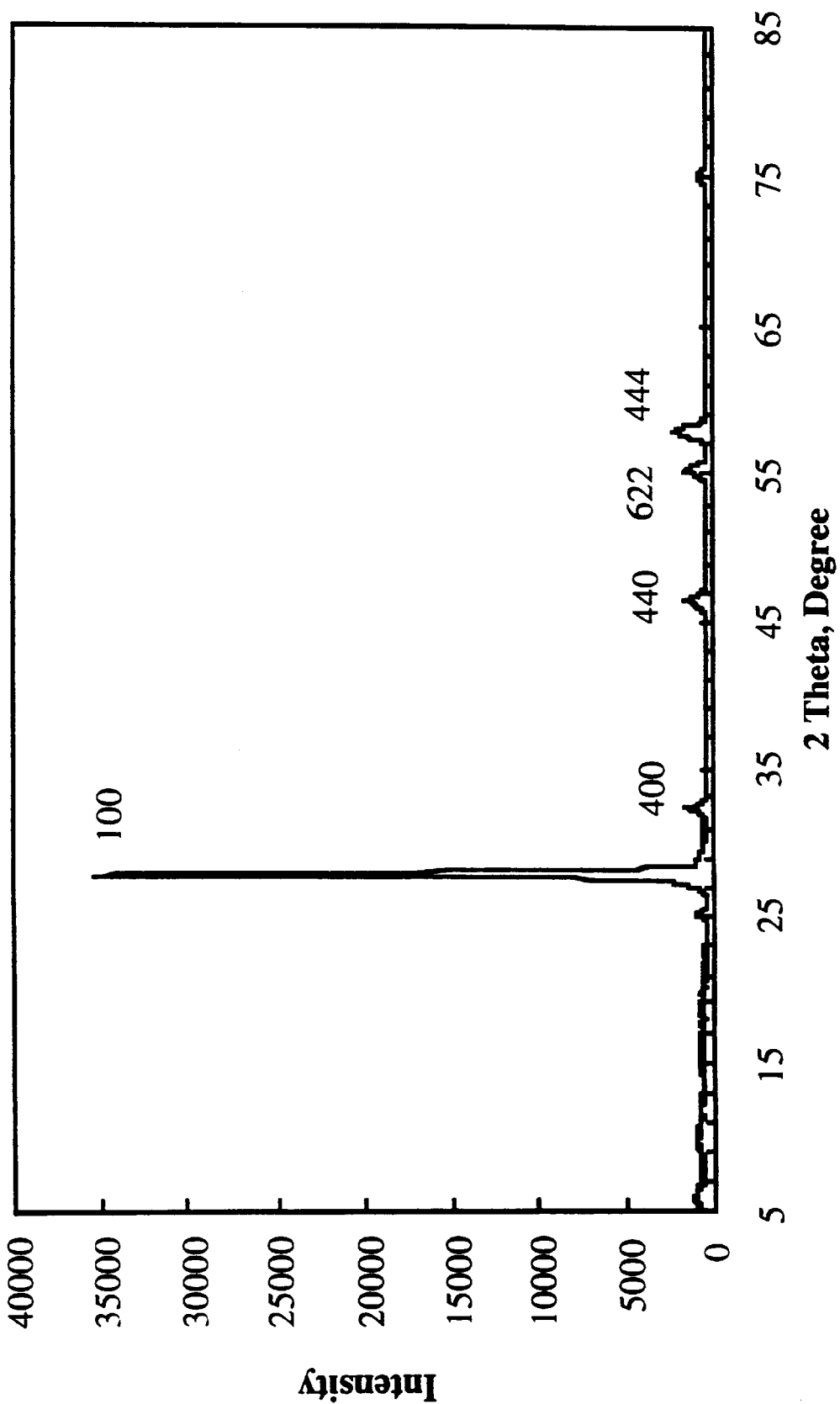

FIG. 7 shows an X-ray diffraction scan obtained from the surface of the coating. The diffraction peaks have been indexed to the pyrochlore crystal structure which demonstrates that the pyrochlore structure was formed in the deposited thermal barrier coating.

Although this invention has been shown and described with respect to detailed embodiments thereof, it will be understood by those skilled in the art that various changes, omissions and additions in form and detail thereof may be made without departing from the spirit and scope of the claimed invention.

I claim:

1. In a superalloy gas turbine component which operates in an environment with gas temperatures in excess of 1,000° C., said component having internal cooling passages, the improvement which comprises a coating of a ceramic having a pyrochlore crystal structure, said coating being located to reduce heat flow into said component.

2. A gas turbine engine component which comprises a superalloy substrate having a layer consisting essentially of lanthanum zirconate on at least a portion of it's external surface.

3. A superalloy gas turbine engine component as in claim 1 wherein said pyrochlore has the formula $A_2B_2O_7$ and a cubic structure.

4. A superalloy gas turbine engine component as in claim 3 wherein the component is composed of material selected from the group consisting of steels, superalloys, titanium alloys and copper alloys.

5. A superalloy gas turbine engine component as in claim 3 wherein the A constituent comprises La, Gd, Y, and single phase mixtures thereof.

6. A superalloy gas turbine engine component as in claim 3 wherein the B constituent comprises Hf, Ti, Zr, and single phase mixtures thereof.

7. A superalloy gas turbine engine component as in claim 1 wherein said pyrochlore has a columnar microstructure.

8. A superalloy gas turbine engine component as in claim 1 wherein said component has an oxide scale on its outer surface, said oxide consisting essentially of alumina, and wherein said cubic pyrochlore ceramic coating is bonded to said oxide scale.

9. A superalloy gas turbine engine component as in claim 2 wherein said pyrochlore has a cubic structure.

10. A superalloy gas turbine engine component as in claim 2 wherein said pyrochlore has a columnar microstructure.

11. A superalloy gas turbine engine component as in claim 2 wherein said component has an oxide scale on its outer surface, said oxide consisting essentially of alumina, and wherein said cubic pyrochlore ceramic coating is bonded to said oxide scale.

12. A superalloy gas turbine engine component as in claim 2 wherein the ceramic is applied by thermal spray.

13. A superalloy gas turbine engine component as in claim 2 wherein the ceramic is applied by plasma spray.

14. A superalloy gas turbine engine component as in claim 2 wherein the ceramic is applied by EB-PVD.

* * * * *